(12) United States Patent
Kirovski et al.

(10) Patent No.: US 7,505,897 B2
(45) Date of Patent: Mar. 17, 2009

(54) GENERALIZED LEMPEL-ZIV COMPRESSION FOR MULTIMEDIA SIGNALS

(75) Inventors: Darko Kirovski, Kirkland, WA (US); Zeph Landau, Hastings on Hudson, NY (US)

(73) Assignee: Microsoft Corporation, Redmond, WA (US)

( * ) Notice: Subject to any disclaimer, the term of this patent is extended or adjusted under 35 U.S.C. 154(b) by 764 days.

(21) Appl. No.: 11/045,843

(22) Filed: Jan. 27, 2005

(65) Prior Publication Data

US 2006/0167688 A1     Jul. 27, 2006

(51) Int. Cl.
*G10L 15/00*     (2006.01)
*G10L 19/00*     (2006.01)
*G10L 21/04*     (2006.01)

(52) U.S. Cl. ............ 704/203; 704/200.1; 704/503; 704/504; 704/236

(58) Field of Classification Search .......... 704/236–240
See application file for complete search history.

(56) References Cited

U.S. PATENT DOCUMENTS 6,374,216 B1 * 4/2002 Micchelli et al. ............ 704/236
7,333,930 B2 * 2/2008 Baumgarte ............... 704/200.1

OTHER PUBLICATIONS

Cooper, M.; Foote, J., "Summarizing popular music via structural similarity analysis," Applications of Signal Processing to Audio and Acoustics, 2003 IEEE Workshop on. , vol., no., pp. 127-130, Oct. 19-22, 2003.*
Hsuan-Huei Shih; Narayanan, S.S.; Kuo, C.-C.J., "Automatic main melody extraction from midi files with a modified Lempel-Ziv algorithm," Intelligent Multimedia, Video and Speech Processing, 2001. Proceedings of 2001 International Symposium on , vol., no., pp. 9-12, 2001.*

* cited by examiner

*Primary Examiner*—Vijay B Chawan
*Assistant Examiner*—Matthew Baker
(74) *Attorney, Agent, or Firm*—Lee & Hayes, PLLC

(57) ABSTRACT

The subject matter includes systems, engines, and methods for generalizing a class of Lempel-Ziv algorithms for lossy compression of multimedia. One implementation of the subject matter compresses audio signals. Because music, especially electronically generated music, has a substantial level of repetitiveness within a single audio clip, the basic Lempel-Ziv compression technique can be generalized to support representing a single window of an audio signal using a linear combination of filtered past windows. Exemplary similarity searches and filtering strategies for finding the past windows are described.

17 Claims, 12 Drawing Sheets

GENERALIZED LEMPEL-ZIV COMPRESSION FOR MULTIMEDIA SIGNALS

TECHNICAL FIELD

The subject matter described herein relates generally to data compression and more specifically to generalized Lempel-Ziv compression for multimedia signals.

BACKGROUND

Repetition is often a principal part of composing music and is a natural consequence of the fact that distinct instruments, voices, and tones are used to create a soundtrack. Thus, similar blocks of music are likely to be found within a single musical piece, an album of songs from a single author, or within instrument solos. Finding similarities within musical pieces is a challenging task. First, redundancies are often superimposed. Next, it is difficult to model redundancies in music as opposed to, for example, video where camera and object motion have well-defined mathematical models.

In particular, music that is performed by humans commonly exhibits like patterns that sound repetitive to the human ear but have significant variance in amplitude, pitch, and timing, mathematically. Detecting similar blocks in such humanly performed pieces is a complex task that is not addressed by modem psychoacoustic models. Perceptually similar blocks of music can be quite distant in a Euclidean sense. However, the human auditory system may perceive them as equivalent.

On the other hand, electronic music is often generated using exact replication and/or mixing of certain blocks of audio. In a memory-based model of the source signal, this phenomenon can be utilized to improve compression rates achieved by conventional memory-less or simple prediction-based audio compression algorithms such as MP3 or AAC (see, for example, K. Brandenburg, "MP3 and AAC explained," *Proceedings of the AES 17th International Conference on High Quality Audio Coding*, 1999). An overview of key techniques for perceptual coding of audio can be found in T. Painter and A. Spanias, "Perceptual coding of digital audio," *Proceedings of the IEEE*, pp.451-513, April 2000.

Kirovski and Petitcolas use naturally occurring similarities in music to perform test attacks on watermark-based content protection systems (D. Kirovski and F. A. P. Petitcolas, "Replacement attack on arbitrary watermarking systems," *ACM Workshop on Digital Rights Management*, 2002. A similar approach is needed to achieve better compression rates for music.

SUMMARY

The subject matter includes systems, engines, and methods for generalizing a class of Lempel-Ziv techniques for lossy compression of multimedia. One implementation of the subject matter compresses audio signals. Because music, especially electronically generated music, has a substantial level of repetitiveness within a single audio clip, the basic Lempel-Ziv compression technique can be generalized to support representing a single window of the audio signal using a linear combination of filtered past windows. Exemplary similarity searches and filtering strategies for finding the past windows are described herein.

One implementation of the subject matter uses a beat encoder to speed up similarity searches. Decompression of audio signals compressed by the subject matter is also described. Parameter selection for optimizing compression rates and performance of the-exemplary systems, engines, and methods on benchmark audio clips is also presented.

DETAILED DESCRIPTION

Overview

Figure 1:
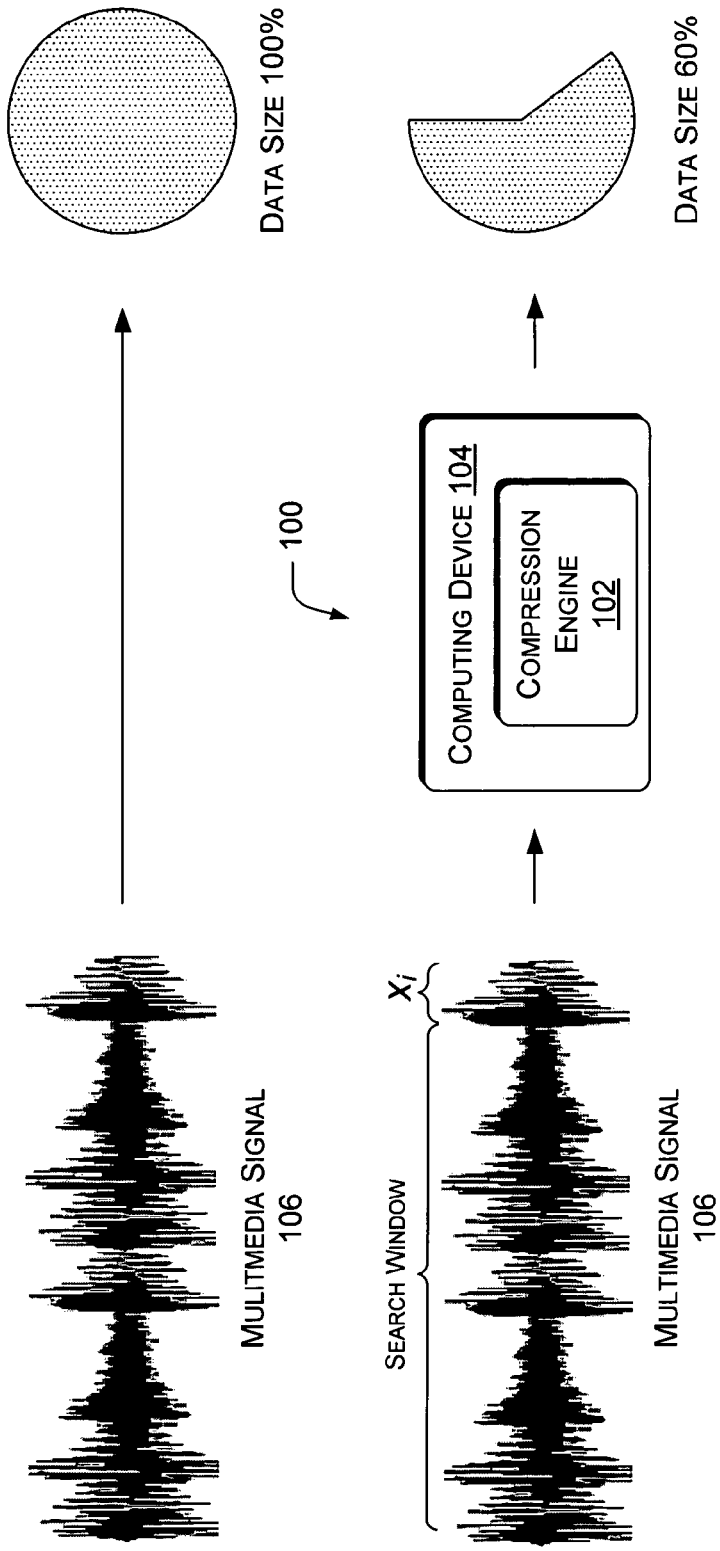
FIG. 1 is a diagrammatic representation of an exemplary system for signal compression.

Described herein are exemplary systems, engines, and methods for compressing multimedia signals, for example, audio signals. In one implementation, the subject matter can be used with signal models that support memory. FIG. 1 shows an exemplary system 100, in which an exemplary compression engine 102 is hosted in a computing device 104 that includes memory. Using principles of predictive coding and Lempel-Ziv compression, the compression engine 102 performs an exemplary method that includes a similarity search for each block $x_i$ of a source multimedia signal 106 in order to find a set of prior blocks whose linear combination predicts $x_i$ well. A remaining error signal can then be quantized and encoded jointly with the parameters of the linear prediction to create a compressed signal.

In one implementation, using a linear quantizer with a −52 decibel (dB) step and an entropy encoder, a compression engine 102 performing an exemplary method achieves significant compression ratio improvements—e.g., 40% compression—especially for electronically generated popular musical pieces. Exemplary coding techniques performed by the compression engine 102 may use similarity and psychoacoustic models to find near-optimal basis vectors, that is, blocks that form a starting basis for a predictive linear combination of blocks to predict the current block. In many cases, the subject matter achieves a superior compression ratio at a negligible increase in computational complexity at signal decompression.

Figure 2:
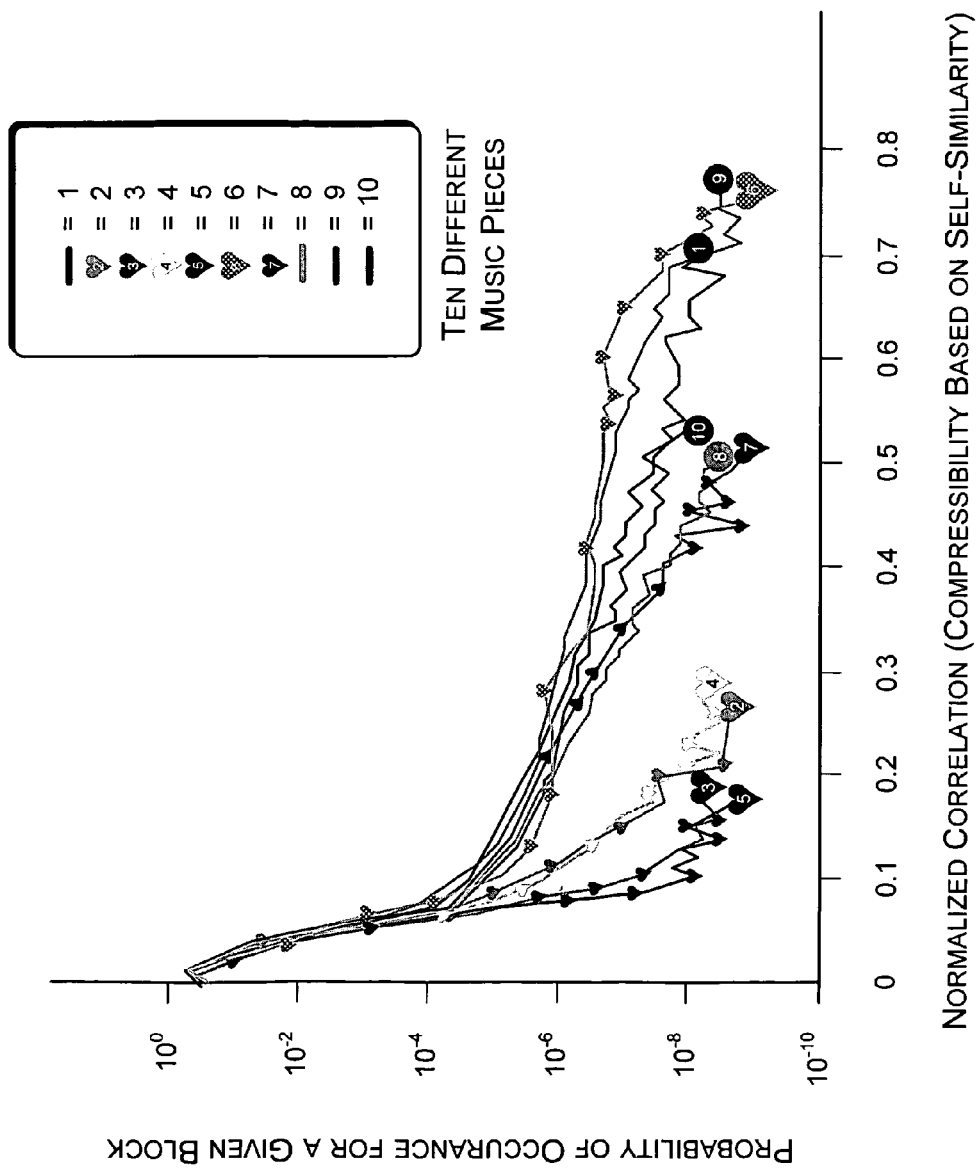
FIG. 2 is a diagrammatic representation of compressibility of ten different music pieces using an exemplary compression engine.

FIG. 2 shows compressibility based on self-similarity of ten different music pieces ("audio clips") using exemplary methods described herein. Each audio clip is partitioned into transform blocks, each block including 2048 samples, with a 50% overlap of blocks—an analysis structure typical for modern audio codecs. Exemplary methods use a modulated lapped transform "MLT" in determining compressibility (see, for example, H. Malvar, "A modulated complex lapped transform and its application to audio processing," *IEEE International Conference on Acoustics, Speech, and Signal Processing*, 1999). In accordance with MLT, one implementation considers only coefficients in the 2-7 KHz sub-band; each clip filtered using a corresponding band-pass filter. FIG. 2 illustrates the probability that for one of the first 240 blocks (i.e., one of the 2048-sample-long windowed MLT blocks), a matching block can be found in the subsequent 60 seconds of the clip and with a certain correlation. The figure presents individual probability distribution functions for a benchmark of the ten audio clips (which are described in more detail further below). Audio clips 1 and 6-10, which represent partly electronically generated music, possess significant self-similarity with relatively common matching blocks that correlate better than 0.5. This self-similarity is searched out by exemplary methods to improve the compression rate of audio clips.

Exemplary Compression Engine

Figure 3:
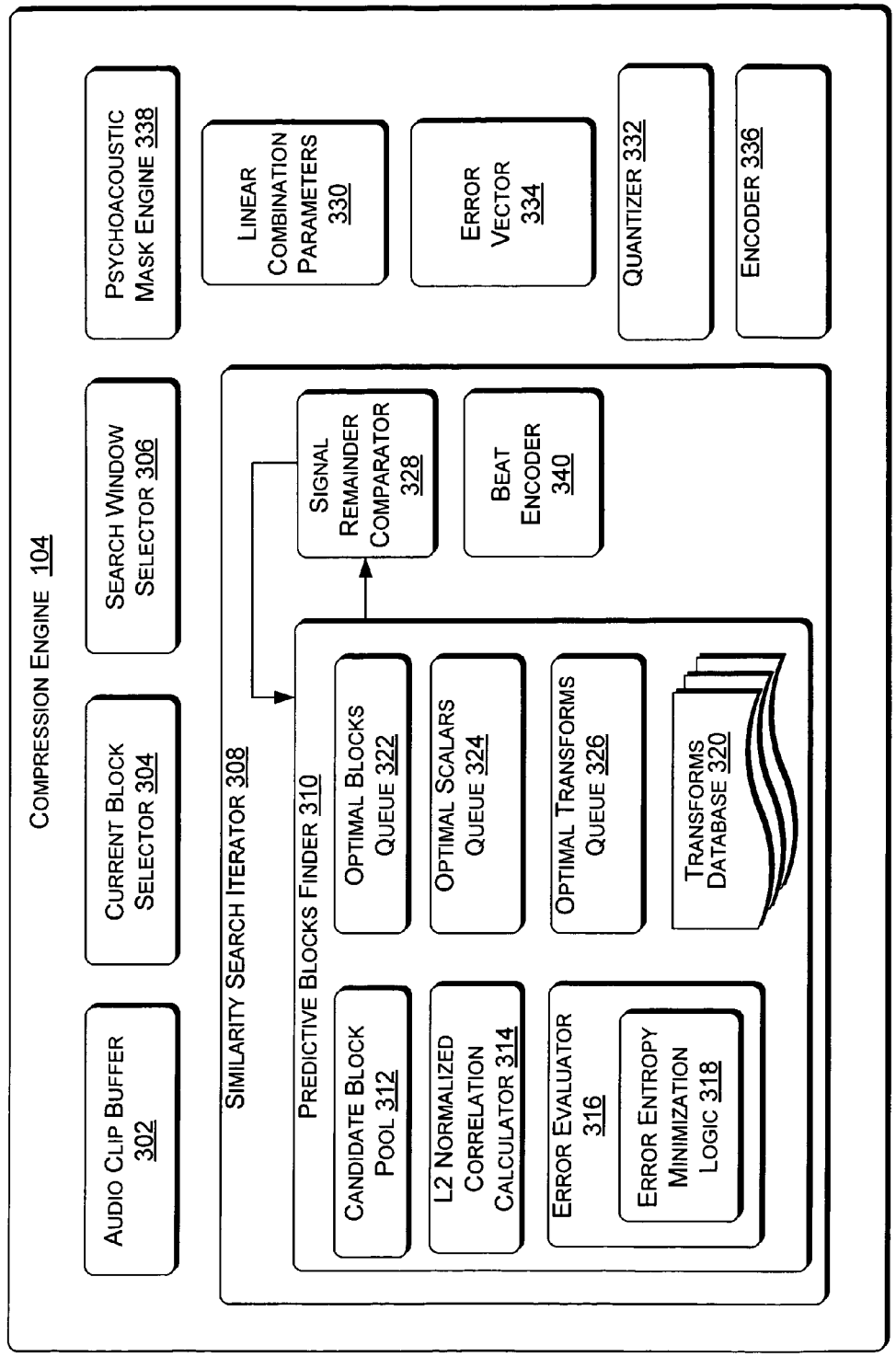
FIG. 3 is a block diagram of an exemplary compression engine.

FIG. 3 shows an overview of the exemplary compression engine 102 of FIG. 1 in greater detail. The compression engine 102 illustrated in FIG. 3 is meant to provide one example arrangement for the sake of overview. Many other arrangements of the illustrated components, or similar components, are possible. Techniques performed by such a compression engine 102 will be explained in greater detail with respect to FIG. 4. It is worth noting that an exemplary compression engine 102 can be executed in hardware, software, or combinations of hardware, software, firmware, etc.

In an audio implementation, an audio clip buffer 302 provides enough memory to hold part of all of an audio clip. That is, the audio clip buffer 302 has enough capacity to hold a current signal block as selected by the current block selector 304 and a search window of preceding signal blocks in the same audio clip, as determined by the search window selector 306.

A similarity search iterator 308 performs several functions, including finding an audio block that precedes the current block being processed to use as a starting basis vector. Thus, the search iterator 308 includes a predictive blocks finder 310 to find a first prior block in the audio clip that possesses significant similarity with the current block. This first prior block is used as a starting basis upon which a linear combination of this and other blocks will predict the current block.

In one implementation, a candidate block pool 312 holds a relatively small number of blocks from the audio clip that are determined by the similarity search iterator 308 to have useful similarity with the current block. An L2 normalized correlation calculator 314 may perform an initial evaluation of blocks in the above-mentioned search window using L2 Euclidean norms of vectors to quickly find signal blocks that are similar to the current block.

Each signal block in the candidate block pool 312 is subjected to an error evaluator 316 that uses error entropy minimization logic 318. The entropy minimization logic 318 aims to find out which of the candidate blocks is the most similar to the current block, by determining which candidate block results in the least error when the candidate block tries to represent the current block.

In one implementation, the similarity search iterator 308 does not perform its functions on "raw" multimedia signals, but rather filters or transforms the signals into mathematical quantities amenable to processing by a compression engine 102. Thus, a transforms database 320 stores a limited number of transforms for this purpose and one of the tasks of the similarity search iterator 308 is to select a transform that results in the least similarity error between a candidate prior block and a current block.

When the predictive blocks finder 310 has determined an effective starting block with good similarity to the current block, it will also have found an effective transform and an effective scalar, e.g., for equilibrating differences in amplitude between the effective candidate block and the current block. Thus, the error entropy minimization logic 318 finds an effectively similar prior block, an effective transform, and an effective scalar. These are stored, respectively, in an optimal blocks queue 322, an optimal scalars queue 324, and an optimal transforms queue 326.

When the signal predicted by the effective candidate block (with its corresponding transform and scalar) is compared with (e.g., subtracted from) the current block by a signal remainder comparator 328, the error or difference is itself a signal that can be fed back into the predictive blocks finder 310. In one implementation, this type of iteration—that returns a similar block and the resulting error—may be performed several times by the similarity search iterator 308 until the error is very small. When the expense of further processing is not worth a further increase in compression bit savings, then the optimized linear combination parameters 330 describing the effective blocks, transforms, and scalars (that are effective in linear combination for predicting the current block) are passed to a quantizer 332 together with the remaining error (i.e., the minimized error vector 334) to be quantized and then encoded by the encoder 336—as a compressed form of the audio signal.

In some implementations, a psychoacoustic mask engine 338 may reduce data to be compressed by providing an audibility mask, that is, discarding signal detail that makes no appreciable difference to the human ear in the final decompressed signal. In other words, a great deal of data can be wasted trying to capture audio detail that cannot be detected by a human and/or that can be fairly well-approximated using less data. Thus, in one implementation a psychoacoustic mask engine 338 may chop off a part of the signal that approaches low or subsonic frequencies, or make other approximations. The psychoacoustic mask engine 338 may perform its functions during the similarity search iterations that search for blocks similar to the current block, i.e., the error entropy minimization logic 318 may use a psychoacoustically masked version of a candidate block sample in determining similarity and/or minimum error entropy. The psychoacoustic mask engine 338 may also provide a final masking to reduce data before passing the optimized linear combination parameters 330 and the minimized error vector 334 to the quantizer 332 and the encoder 336.

A beat encoder 340 may be included in some implementations to increase the efficacy of the similarity search iterator 308. Exemplary similarity searches using beat detection will be discussed in greater detail below.

Exemplary Methods

Figure 4:
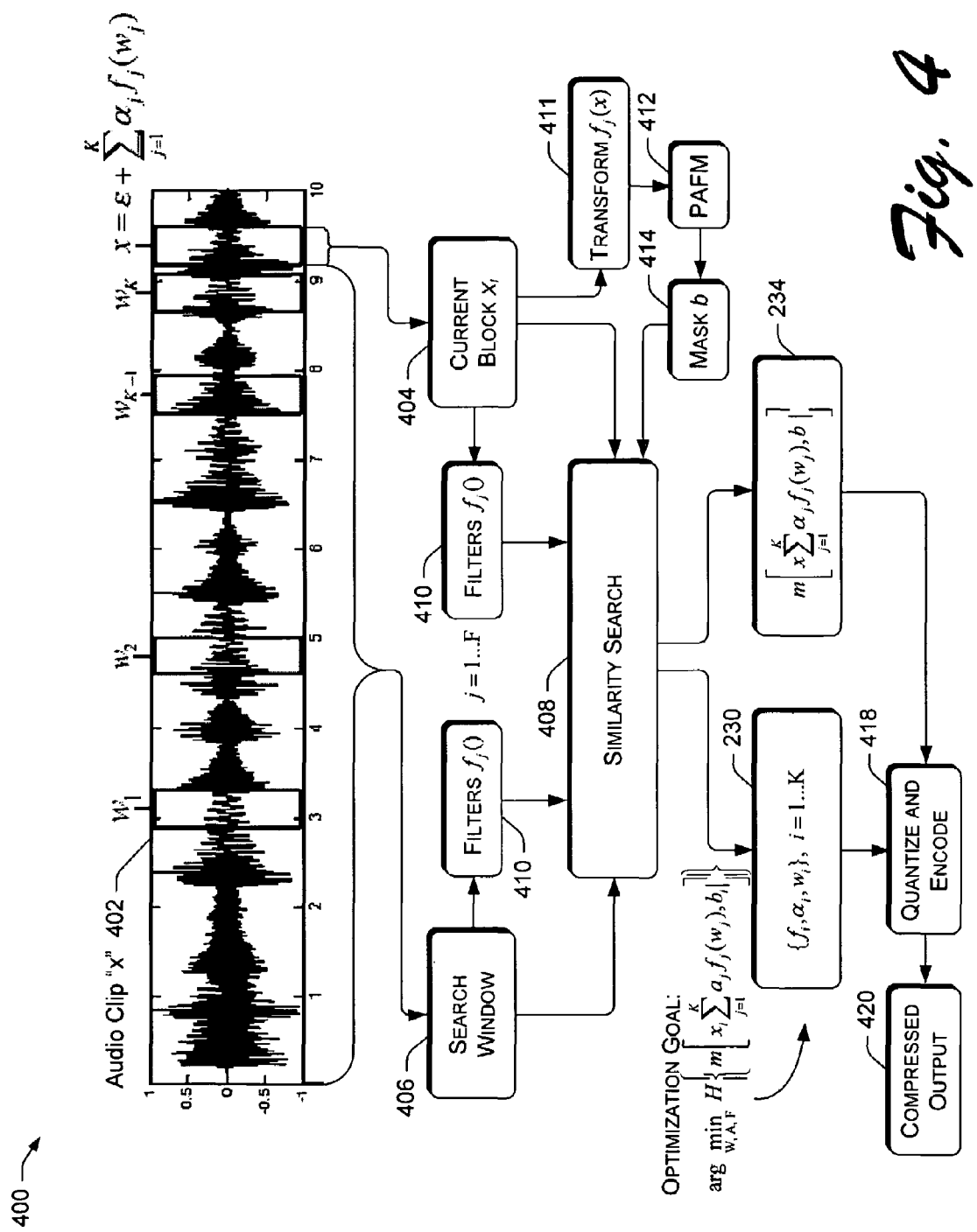
FIG. 4 is a flow diagram of an exemplary compression method.

FIG. 4 shows an exemplary generalized lossy Lempel-Ziv audio compression method 400. In the flow diagram, the operations are summarized in individual blocks. The exemplary method 400 may be performed in various software and hardware implementations, for example, by components of the exemplary compression engine 102 of FIG. 3. The exemplary method 400 can be understood in terms of a generalization of predictive coding (see, e.g., B. Deijavitch, E. M. Deloraine, and S. Van Mierlo, French Patent No. 932140, August 1946; also filed as U.S. Pat. No. 2,629,859, October 1947) and the Lempel-Ziv compression algorithm (see, e.g., J. Ziv and A. Lempel, "A Universal Algorithm for Sequential Data Compression," *IEEE Transactions on Information Theory*, Vol.23, no.3, pp.337-343, 1977).

For an overview, basic parts of the exemplary compression method 400 are presented in brief using pseudo-code in Table (1):

TABLE 1

Pseudo-code of an exemplary method for generalized lossy Lempel-Ziv compression.

For each current block $x_i$ 1
1. Determine search region $s_i$.
2. Find a set of block pointers W, their filters F, and their amplifiers A, that satisfy fully or approximately the search objective from Equation (1) (shown below).
3. Compute $b_i$, the audibility mask of $x_i$.
4. Mask the representation error, $\epsilon_i = x_i - r_i$, where $$r_i = \sum_{j=1}^{K} a_j f_j(w_j), \text{ using a psychoacoustic frequency}$$

model and by applying the function $m(x_i, r_i, b_i)$ defined in Equation (2) (shown below).
5. Quantize and encode W, A, F, and $m(x_i, r_i, b_i)$.
6. Update the original $x_i$ with $r_i + m(x_i, r_i, b_i)$.

In one implementation, a normalized input signal (audio clip) "x" 402 has N samples, where each sample $x_i \subset x$ is normalized $x_i \in [-1, 1]$. The signal 402 is partitioned into 50% overlapping segments ("blocks") of n samples where n is a power of two, commonly within $n \in [512, 4096]$. Much like modern compression algorithms such as MP3, the exemplary method 400 windows each signal block using a perfect reconstruction analysis window and individually compresses it. During decompression, a synthesis window reverses the effect of the analysis window (see, H. Malvar, "A modulated complex lapped transform and its application to audio processing," *IEEE International Conference on Acoustics, Speech, and Signal Processing*, 1999).

At block 404, for a given signal block $x_i = \{x_i, \ldots, X_{i+n-1}\}$, a search window 406 is established $s_i = \{x_{start(i)}, \ldots, x_{i-1}\}$ that either represents the full signal history (i.e., start(i)=1) or has a certain predetermined length S (i.e., i−start(i)=S). A search 408 is then performed for a subset of blocks $W = \{w_j | s_i, j=1 \ldots K\}$ and a set of corresponding scalars $A = \{\alpha_j \epsilon A \subset R, j=1 \ldots K\}$ and transforms 411: $F = \{f_j(R^n) \to R^n, f_j \subset F, j=1 \ldots K\}$, where F is the set of all considered transforms, e.g., in the transforms database 320. Sets F, A, and W satisfy the following optimization goal:

$$\arg\min_{W,A,F} H\left\{m\left[x_i, \sum_{j=1}^{K} a_j f_j(w_j), b_i\right]\right\}. \quad (1)$$

In one implementation, the set of transforms (i.e., "filters") "F" 411 consists of time-to-frequency transforms, such as the MLT (see, e.g., H. Malvar, "A modulated complex lapped transform and its application to audio processing," *IEEE International Conference on Acoustics, Speech, and Signal Processing*, 1999) or the modified discrete cosine transform (MDCT) with different band-pass filters (see, K. Brandenburg, "MP3 and AAC explained," *Proceedings of the AES 17th International Conference on High Quality Audio Coding*, 1999). For example, an exemplary transform $f_j(w_j)$ applies the MLT to the block $w_j$ and zeroes out the resulting frequency coefficients below 100 Hz.

At blocks 412, representation error $$\varepsilon = x_i - \sum_{j=1}^{K} a_j f_j(w_j) = x_i - r_i$$

is masked using a psychoacoustic filter m( ) as follows. The psychoacoustic mask $b_i$ 414 of the source block $x_i$ is computed. The mask $b_i \in \{0,1\}^n$ distinguishes audible from inaudible frequency coefficients and can be computed using well known psychoacoustic models (see, K. Brandenburg, "Perceptual coding of high quality digital audio," *Applications of Digital Signal Processing to Audio and Acoustics, Kluwer*, 1998). In one implementation, the masking function m(x,r,b) is defined on a single signal coefficient x, its reconstruction r, and masking bit b:

$$m(x, r, b) \equiv \begin{cases} x - r, & b = 1 \\ 0, & b = 0 \wedge |r| \leq T \\ r - T \cdot \text{sign}(r), & b = 0 \wedge |r| > T \end{cases} \quad (2)$$

where T denotes the hearing threshold for sam/ple x. When applied to vectors, the function m(x, r, b) independently applies the steps from Equation (2) to each vector element. The goal of the masking function m( ) is to set the error such that reconstruction of audible samples is exact whereas the reconstruction of inaudible samples is such that the absolute magnitude of the error is minimized. This is only a heuristic solution to computing the error in an overall goal to reduce the entropy of the error vectors as represented in Equation (1).

In the similarity search 408 (to be described in greater detail in a section further below) function H( )—represented at block 416—computes the entropy of the following information:

H1: Quantized pointers to all blocks in W,
H2: Quantized pointers to the applied transforms F,
H3: Quantized scalars in A used to create the linear combination of transformed blocks, and
H4: The error vector returned by function m( ).

When encoded at block 418, the information (H1-H4) represents the final compressed stream 420. That is, several iterations of the similarity search 408 result in a group of linear combination parameters 330 and a remaining error vector 334 to be quantized and encoded 418. The linear combination parameters 330 describe blocks found in the similarity search—and their associated transforms and scalars—which, when in linear combination, approximately describe the current block 404 using less data than the data of the current block 404 itself. The remaining (minimized) error vector 334 is a "leftover" error residue 334 that undergoes compression with the linear combination parameters 330 in order to reconstitute the current block 404 during decompression. The linear combination parameters 330 are optimized in the sense of minimizing, as far as practical, the remaining error vector 334. In other words, the linear combination parameters 330 aim to describe a block that is as similar to the current block 404 as practical, as indicated by the remaining error 334 being minimized. Storing pointers to a few previous blocks (and related parameters) that can be combined to represent the current block 404 (along with remaining error 334) uses much less data than storing the audio content of the current block 404 itself.

Thus, the optimization goal of the similarity search 408 formalized in Equation (1) is to find a set W of K blocks which occur prior to current block $x_i$ 404 and a linear combination of their transforms $r_i$, which represents the current block $x_i$ 404 as closely as possible in the sense of minimizing the entropy of the remaining error vector $m(x_i, r_i, b_i)$ 334.

It should be noted that compression error can accumulate as signal blocks are compressed using prior, already compressed blocks as a basis. In order to prevent error propagation, the compression error per block can be limited to the relative error caused by a single iteration of an exemplary compression engine 102 performing an exemplary method 400. This can be achieved in the last part of the compression iteration, by replacing block $x_i$ in the source clip x 402 with $r_i + m(x_i, r_i, b_i)$.

Compression Parameters

Optimizing parameters for the exemplary method 400 can involve a tradeoff of benefits. Specifically, choices that would reduce the entropy contribution of (H4) above, such as increasing the sizes of A, F, K, or decreasing the block size n, have the effect of increasing the entropy contribution of (H1-H3). Conversely, decreasing the size of A, F, K, or increasing the blocksize n reduces the entropy contribution of (H1-H3) but has the effect of giving a worse approximation of the signal which increases the entropy contribution of (H4).

Independent of these considerations are the choices of the elements of F (transforms) 320 and A (amplifiers, or scalars).

Exemplary parameters produce a compression schema that possesses reasonably good compression characteristics. In one implementation, K is limited to be less than 3. Blocksize can be fixed at n=1024 although in alternative implementations, n can be variable. Such variable block length fully mimics the original Lempel-Ziv compression paradigm (see J. Ziv and A. Lempel. "A Universal Algorithm for Sequential Data Compression," *IEEE Transactions on Information Theory*, Vol.23, no.3, pp.337-343, 1977). A predefined set A of amplifiers (scalars) can be used, for example, A={-1.0,-0.1, 0.1, 0.2, 0.5, 0.8, 0.9, 1.0, 1.1, 1.2}. The set of transforms F 320 can be limited to F={$f_1 \ldots f_5$} as follows: $f_1$, $f_2$, $f_3$ can be low-pass (0,64), mid-pass (65,167), and high-pass (168-512) filters (respectively) of the MLT coefficients; $f_4$ can be a low-stop filter that removes the lowest eighth of all n MLT coefficients; and $f_5$ can be an all-pass filter.

In one implementation, the quantization and encoding techniques 418 are predetermined. A linear quantizer 332 can be used to digitize the compression error $\epsilon_i$. An entropy coder 336 with a unified view on all quantized MLT coefficients can be used to create the final output stream 420. While an entropy coder 336 can usually yield optimum compression results given independent identically distributed samples, such does not necessarily hold true in the case of MLT coefficients. The use of vector or other sophisticated quantizers 332 such as TwinVQ (see, N. Iwakami and T. Moriya, "Transform domain weighted interleave vector quantization (TwinVQ)," *Proceedings of the* 101 *st AES convention,* 1996) is functionally orthogonal to the exemplary compression methods 400 described herein. Just as in conventional compression schemes, using a particular quantizer-encoder system 418 may alter the performance of the entire system significantly.

Certain parts of an exemplary method 400, such as characteristics of function m( ), can be tailored to work optimally with specific quantization-encoding techniques 418.

Exemplary Similarity Search

A similarity search 408 as performed, for example, by a similarity search iterator 308 is described in greater detail. Based upon the repetitiveness of music content, an objective of the similarity search 408 is to find, filter, and combine (partially) similar blocks in order to encode a given current block 404. In the quest for the best achievable compression ratio, several practical considerations for a compression engine 102 can be considered, such as the computational complexity of a similarity search 408 as well as memory requirements of a host computing device 104. For example, an exhaustive search over all blocks in an audio clip 402 to determine similarity with a current block 404 may not be practical, because each candidate block 312 would need to be transformed, filtered, and then used in an entropy calculation. Thus, the following describes components of an exemplary similarity search 408 for achieving relatively fast, yet significant compression ratio improvements for electronically generated music.

In one implementation, an exemplary similarity search 408 exploits the fact that searching for similarity based on the "L2 (Euclidean) norm for vectors" metric is fast. A limited, small set of linear operators G={$g_1 : 1 \leq l \leq L$} can be selected where $g_1: R^n \rightarrow R^n$, for which there is a reasonable probability that L2 similarity for $g_1(x)$ and $g_1(w)$ will lead to small values for H{$m(x_i, af(w), b_i)$} for at least one choice of $\alpha \in A$, f $\in$ F. Then an exemplary similarity search 408 iteratively performs the following actions, as summarized by the pseudo-code presented in Table (2):

TABLE 2

Pseudo-code for an exemplary similarity search based on Gram-Schmidt orthonormalization.

For each block $x_i$
1.     Set $\epsilon_i = x_i$.
2.     Determine corresponding search window $s_i$.
3.     For l = 1 . . . L
4.     Find a set P of P n-long blocks $s_{i,j} \in \Phi$, $s_{i,j} \subset s_i$ with largest $g_l(s_{i,j}) \cdot g_l(x_i) / (\|g_l(s_{i,j})\| \cdot \|g_l(x_i)\|)$.
5.     $\{\alpha_j, fj( ), wj\}$ = arg min H{$m(x_i, \alpha f(s_{i,j}), b_i)$} over all $\alpha \in R$, f( ) $\in$ F, and $s_{i,j} \in P$.
6.     $\epsilon_i = \epsilon_i - \alpha_j f_j(w_j)$.

An exemplary method 400 or compression engine 102 determines a pool P of candidate blocks 312 by choosing, for each l, the blocks $s_{i,j}$ within the search window $s_i$ 406 of length n for which $g_l(s_{i,j})$ is maximally correlated in L2 norm to $g_l(x_i)$:

$$\arg\min_j \left\| \frac{g_l(s_{i,j})}{\|g_l(s_{i,j})\|} - \frac{g_l(x_i)}{g_l(\|x_i\|)} \right\| =$$

$$\arg\max_j \frac{g_l(s_{i,j}) \cdot g_l(x_i)}{\|g_l(s_{i,j})\| \cdot \|g_l(x_i)\|} = \arg\max_j \frac{s_{i,j} \cdot g_l^*(g_l(x_i))}{\|g_l(s_{i,j})\| \cdot \|g_l(x_i)\|}$$

where operator a·b denotes an inner product of vectors a and b; operator $\|a\|$ denotes the L2 norm of the vector a, and g* denotes the adjoint linear operator of g.

One feature of this approach is that the computation of all normalized correlations si, j·g*$_l$($g_l(x_i)$) for each block $s_{i,j}$ of length n in $s_i$ can be done quickly by convolving the complex conjugate of $g^*_l(g_l(x_i))$ with $s_i$ via the Fast Fourier Transform and the overlap-add fast convolution method (see, for example, A. V. Oppenheim and R. W. Schafer, "Discrete-time signal processing," *Prentice-Hall*, 1989). This approach can be used to efficiently compute the L2 norm of each candidate block $g_l(s_{i,j})$. The complexity of this step can be represented by $O(N\log_2 n)$ assuming n is a power of two. The top P correlated blocks from $s_i$ for each l are denoted as the most similar ones to current block $x_i$ 404 and are put into P. the candidate block pool 312. Next, each block $s_{i,j}$ from this pool of candidates 312 is evaluated as a solution by searching for the minimal $H\{m(x_i, \alpha f(s_{i,j}), b_i)\}$ over the entire search spaces $\alpha \in A$ and $f \in F$ (thus, these spaces should be chosen to be relatively small).

The result of this best-effort search is adopted as the first basis vector $w_1$ in the set W along with its accompanying parameters $f_1()$ and $\alpha_1$. That is, the first basis vector is the first block in a linear combination of blocks that will describe the current block 404. Next, the most similar point $w_l$ is subtracted from $x_i$ as $x_i - \alpha_1 f_1(w_1)$. In the subsequent iteration, the similarity of $x_i - \alpha_1 f_1(w_1)$ with $s_i$ is computed, the best match $w_2$ is found, and it is subtracted from the remainder as $x_i - \alpha_1 f_1(w_1) - \alpha_2 f_2(w_2)$. The similarity search iterator 308 searches for the best second combination $\{\alpha_2, f_2()\}$ using the same procedure that searched for the best first $\{\alpha_1, f_1()\}$ pair. These two actions, searching for the best approximation of the remainder of the signal, and then its subtraction, are iterated as long as improvement in the entropy of the remaining signal:

$$H\left\{m\left[x_i \sum_{j=1}^{K} \alpha_j f_j(w_j), M\right]\right\} - H\left\{m\left[x_i \sum_{j=1}^{K} \alpha_j f_j(w_j), b_i\right]\right\}$$

is greater than the number of bits required to encode $\alpha_K$, $f_K()$, and the pointer to $w_K$.

The exemplary similarity search 408 described here takes a "greedy" approach: in each iteration, the candidate block that reduces the error entropy the most is chosen. This approach is common for many types of problems as it often reduces the search space dramatically. Thus, in one implementation, the exemplary similarity search 408 does not search for the K blocks that combine to produce the best entropy reduction, because this increases the complexity of the search problem by an exponential factor K.

In alternative implementations, however, an exemplary similarity search 408 looks for blocks that do not individually reduce the entropy of the error optimally, but rather combine with other blocks to jointly effect a better entropy reduction. A given block x may describe a mixture of several sounds, for instance, the sounds of two different instruments that are playing at different frequency ranges. Suppose in past blocks, each of these instruments have played the same notes but at different times, i.e., there are two blocks, $s_1$ and $s_2$ such that $s_1$ is a good match for x in one frequency range and $s_2$ is a good match for x in another. Hence, an appropriately filtered combination of $s_1$ and $s_2$ would be a good entropy approximation for x. Thus, in one implementation, the "greedy" similarity search 408 described above can be augmented with complementary filters $f_i$ that filter different frequency ranges and search for blocks that combine together to produce improved compression results.

Exemplary Parameters for a Similarity Search

In one implementation of an exemplary similarity search 408, a small set of linear operators are selected, $G=\{g_l: 1 \leq l \leq 7\}$, with $g_1, g_2, g_3$ consisting of low-pass, mid-pass, and high-pass filters operational in the MLT domain responsible for about one third of the entropy of music. For example, for a block of n=512 MLT coefficients the pass frequencies were set at coefficients 64 and 167; $g_4$ can be a low-stop filter that removes the lowest eighth of all n MLT coefficients; $g_5$ can be a weighting filter that weights each coefficient with the ratio of the entropy (of this coefficient throughout the audio clip 402) to the average absolute value of this coefficient; $g_6$ can be a filter in the time domain corresponding to the window function of the MLT; and in one implementation, $g_7$ does not filter at all.

Exemplary Performance—Compression Analysis

One implementation of an exemplary method 400 was tested using a benchmark collection of audio clips 402 that are each 45-second-long segments, beginning 15 seconds into the audio selections listed in Table (3):

TABLE 3

Audio Clips for Performance Test Benchmark

1. Ace Of Base, Ultimate Dance Party 1999, Cruel Summer (Blazin' Rhythm Remix)
2. Steely Dan, Gaucho, Babylon Sisters,
3. Pink Floyd, The Wall, Comfortably Numb,
4. Dave Matthews Band, Crash, Crash Into Me,
5. Generic classical piece with high perceptual randomness
6. Daft Punk, Discovery, One More Time
7. The Prodigy, The Fat of the Land, Breathe
8. Khal'ed, Arabica, Didi [Didi Funk Club Remix]
9. Paul Oakenfold, Transport, El Ni~no
10. Groove Foundation Press Ku, Amnesia - Ibiza 2001, That Feeling.

In each of the above ten audio clips 402, 100 blocks were randomly selected for input to the compression engine 102 and/or an exemplary method 400 using the parameters K, n, A, F, G as described above. For each $g_l$ in the similarity search 408, the top 200 correlated blocks (P=200) were found to be candidates to use in P, the candidate block pool 312.

Figure 5:
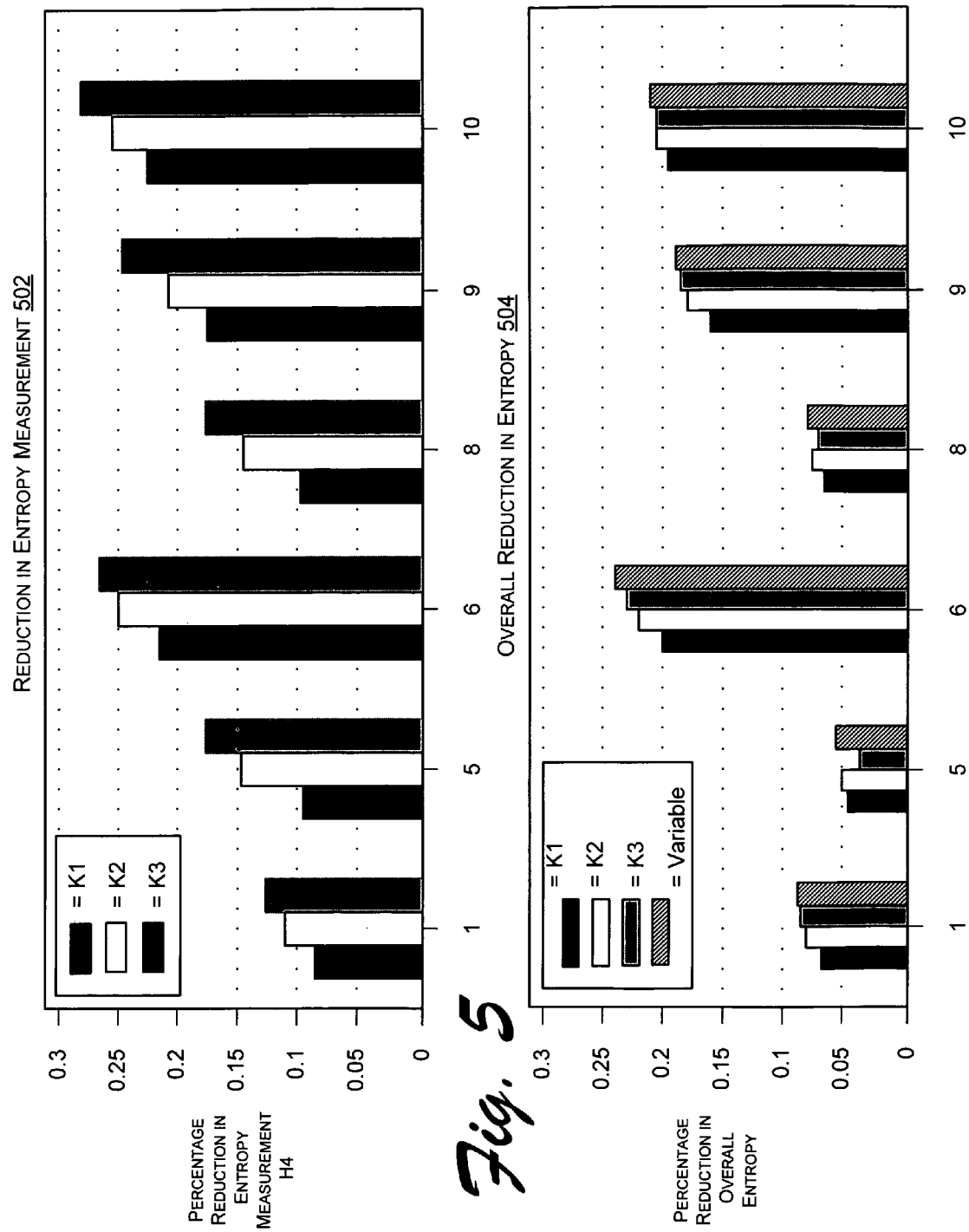
FIG. 5 is a diagrammatic representation of reductions in entropy across multiple iterations of an exemplary method of compression.

FIG. 5 shows the resulting compression in entropy—the entropy reduction performance—for clips 1, 5, 6, 8, 9, and 10. The remaining clips 2, 3, 4, 7 showed little compression gain. The top graph 502 shows the reduction in the entropy of the error signal—the (H4) contribution to the total entropy measurement—after one, two and three iterations. The lower graph 504 incorporates the cost of the pointers (H1-H3), which is approximately 26.5 bits per iteration per block (about 21 bits for the pointer to the similar block, and 5.5 bits for the specification of $\alpha$ and $f_i$). A variable schema for choosing K is as follows: for each block, factor in the bit cost for each additional round, i.e., if the resulting compression in entropy does not exceed (26.5) then stop. The first three bars for each clip 402 on the bottom graph 504 correspond to the total entropy compression for one, two and three iterations; the final bar corresponds to the total entropy using the variable schema for choosing K, just described.

Results included a total entropy reduction of 8.9%, 5.4%, 24.1%, 8.1%, 18.7% and 21.5% respectively for the clips 1, 5, 6, 8, 9, 10. It should be noted that the variable schema produced small but not dramatic improvement in compression. It is also worth noting that compression improvement typically slows rapidly, iteration by iteration, and thus it appears that for the selections of F and A described above, increasing the size of K does not produce much improvement.

The compression results obtained on electronically generated music show significant improvement using an exemplary compression engine 102 or an exemplary method 400 as described above. It is worth emphasizing that some classical audio clips 402, such as classical clip 5 undergo a surprising 5+% compression rate improvement. Although classical clip 5 is performed by a 50+ instrument orchestra and possesses exceptional perceptual randomness, an exemplary similarity search 408 produced a significant impact on the compression rate. The compression rate can be further improved by using advanced perceptual models that take into account, for example, time-scale and pitch variances.

Figure 6:
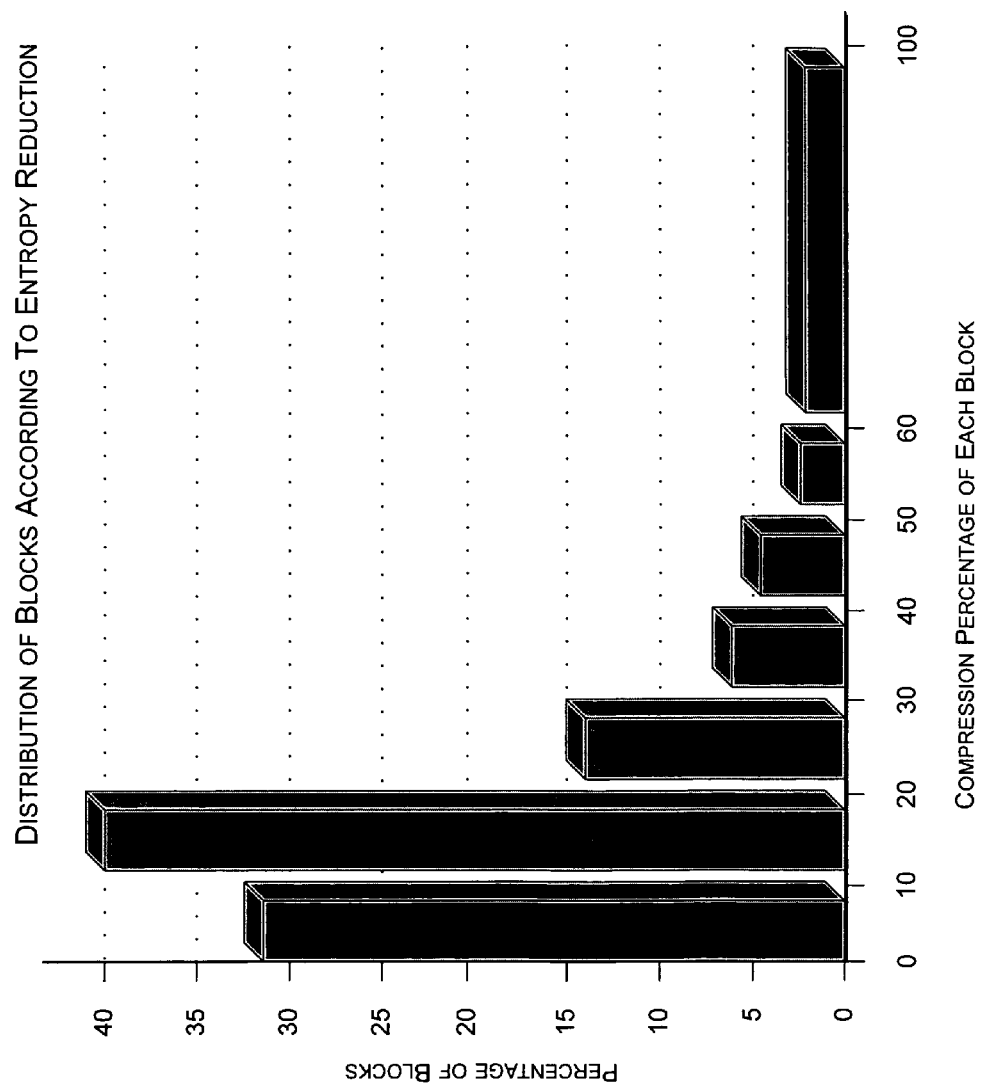
FIG. 6 is a diagrammatic representation of audio blocks in an audio signal distributed according to degree of entropy reduction by an exemplary method.
Figure 7:
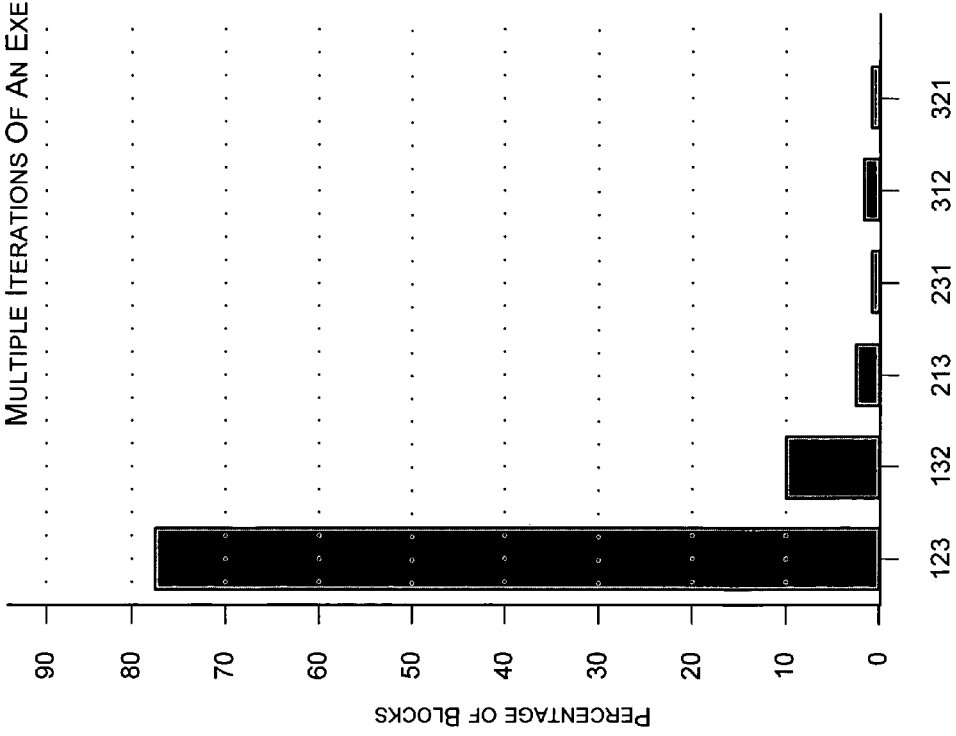
FIG. 7 is a diagrammatic representation of audio blocks in an audio signal distributed according to an order of effectiveness of entropy reduction across multiple iterations of an exemplary method.

FIG. 6 shows an exemplary distribution of entropy reduction. The illustrated histogram depicts the distribution of the reduction in the entropy H4, per block. Approximately 10% of the blocks were compressed by 40% or more. In all blocks, the entropy of the error (H4) decreased iteration by iteration. FIG. 7 shows a ranking of the iterations with respect to this improvement. For instance, if the entropy of the original block is 1500, and the entropy of the error is: 1400, 1250, and 1200 after each iteration, then the ranking of this block is 2-1-3 since the second iteration reduced the entropy by the most (150 bits), iteration one by the second most (100 bits), and iteration three by the least (50 bits). Approximately 81% of the time the ranking is 1-2-3, that is, each successive iteration produces less compression rate improvement. The fact that in over 6% of the blocks, the first iteration does not produce the greatest improvement points to the complex nature of optimizing audio compression.

Exemplary Performance—Parameters Analysis

Figure 8:
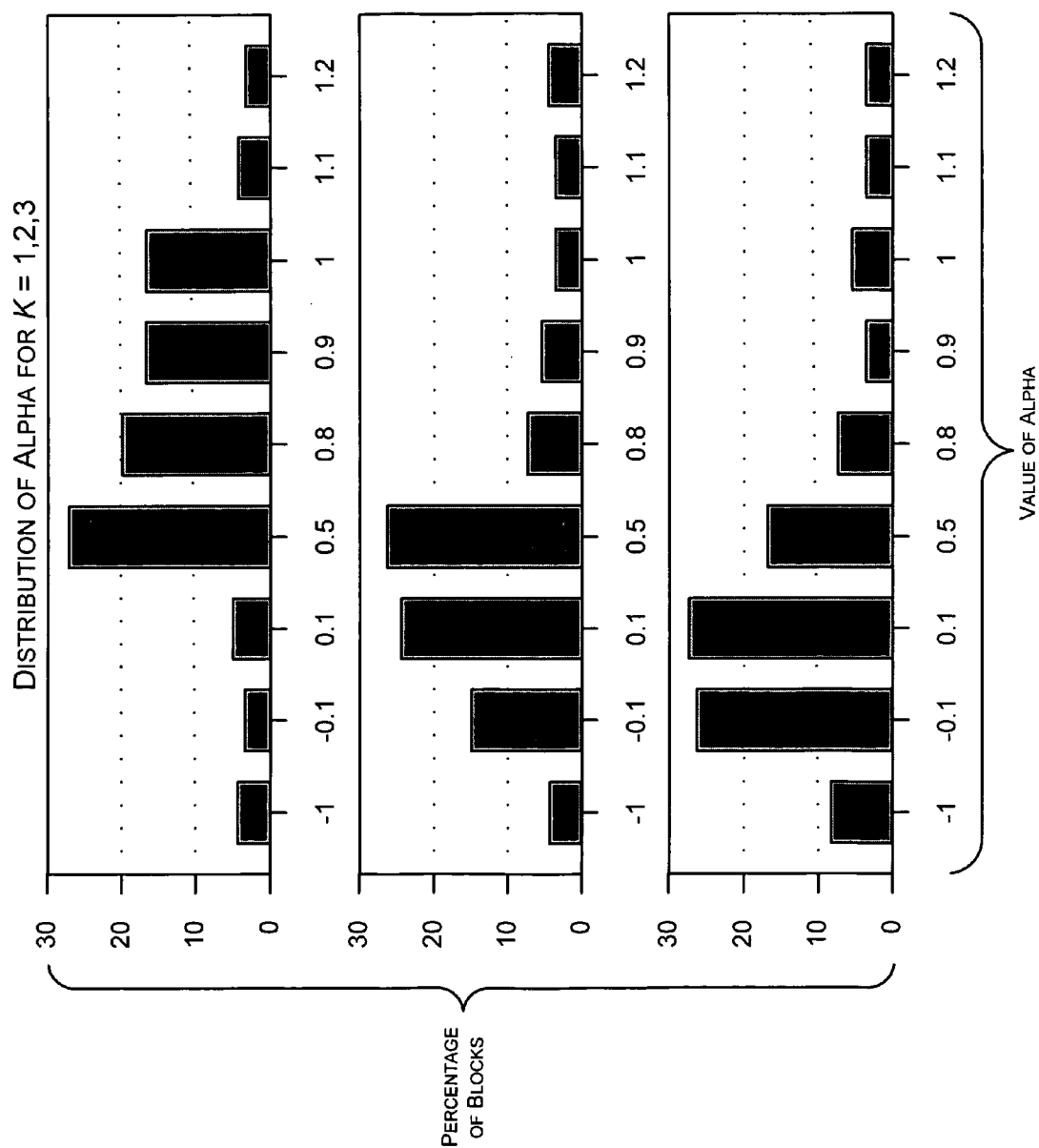
FIG. 8 is a diagrammatic representation of distribution of scalars across first, second, and third iterations of an exemplary method.

FIG. 8 shows a histogram of the distribution of values for the scaling parameter, $\alpha$, selected per iteration. The results indicate that the average value of $\alpha$ decreases iteration by iteration. In one implementation, 28% of the first iteration $\alpha$ selections were equal to 0.5, suggesting that the set A might be optimized by including more values for possible selection that are around 0.5. In one implementation, choice of scaling parameter is improved by having iteration-dependent sets $A_i$, i=1, 2, 3, with $A_1$ concentrated mostly in the range $\alpha \in [0.4, 1]$, $A_2$ concentrated mostly in a lower range including some small negative values, and $A_3$ concentrated in a still lower range.

Alternatively, two heuristics can be used to find the best $\alpha$ parameter associated with a given block $x_i$ and with $f_1$:

(i) $\alpha_1 = x_i \cdot f_1(s_{i,j})/(\|x_i\| \cdot \|f_1(s_{i,j})\|)$, which aims at minimizing the Euclidean distance between $x_i$ and its basis vector $f_1(s_{i,j})$.

(ii) A two step search for the best $\alpha$. In a first step, a particular set of common values for $\alpha$ is searched. An intermediate search result is denoted as $\alpha^*$. In a second step, $\alpha^*$ is fine-tuned by searching in its nearest locality, e.g., an exhaustive search is made for the next best fractional value to obtain the final $\alpha$.

Figure 9:
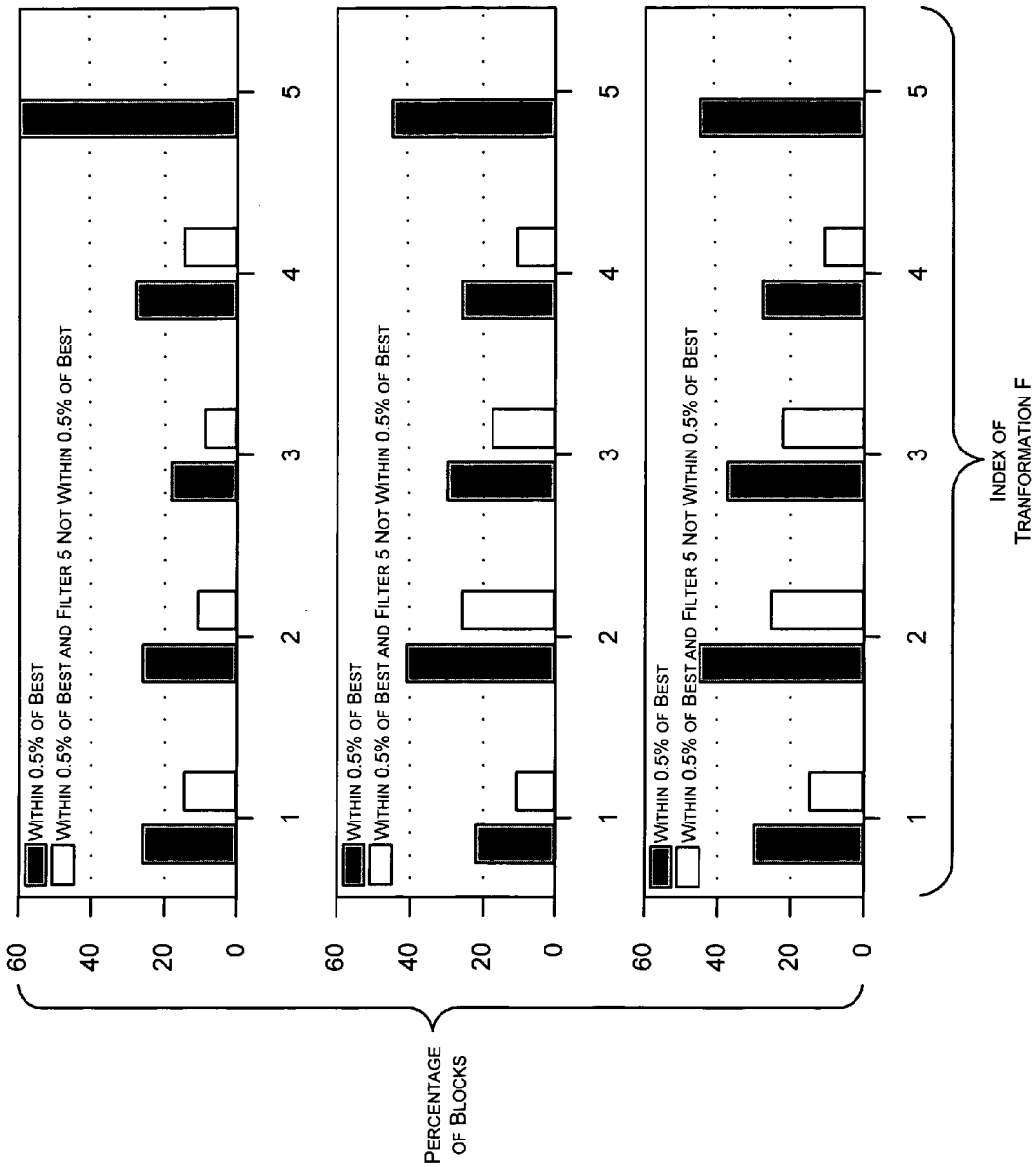
FIG. 9 is a diagrammatic representation of performance of different transforms across first, second, and third iterations of an exemplary method.

FIG. 9 describes the performance of f∈F, the filters 410. The left member of each pair of bars in the graphs gives the percentage of time that the use of a filter $f_i$ produces a reduction in entropy within 0.5% of the best result obtained. In one implementation, for each iteration, $f_5$, an identity filter, produces a result within 0.5% of the best result the most often (as high as 60% of the time in the first iteration). This suggests including $f_5$ in a future choice of F. The difference in the graphs iteration-by-iteration suggests that an iteration-dependent set $F_i$, i=1, 2, 3 might improve results. The right hand member of each pair of bars in the graphs represents the percentage of time that a selected filter produces a reduction in entropy within 0.5% of the best and that the best filter, $f_5$, does not give the result within 0.5% of the best result. Thus, this right hand bar gives some indication of other important filters that might be chosen to complements. It appears that in the second two iterations, the mid-pass filter stands out as particularly effective, which suggests that the choice of $f_2$ or some other medium pass filter can be an effective complement to include with $f_5$ in an iteration-dependent $F_2$ or $F_3$.

Figure 10:
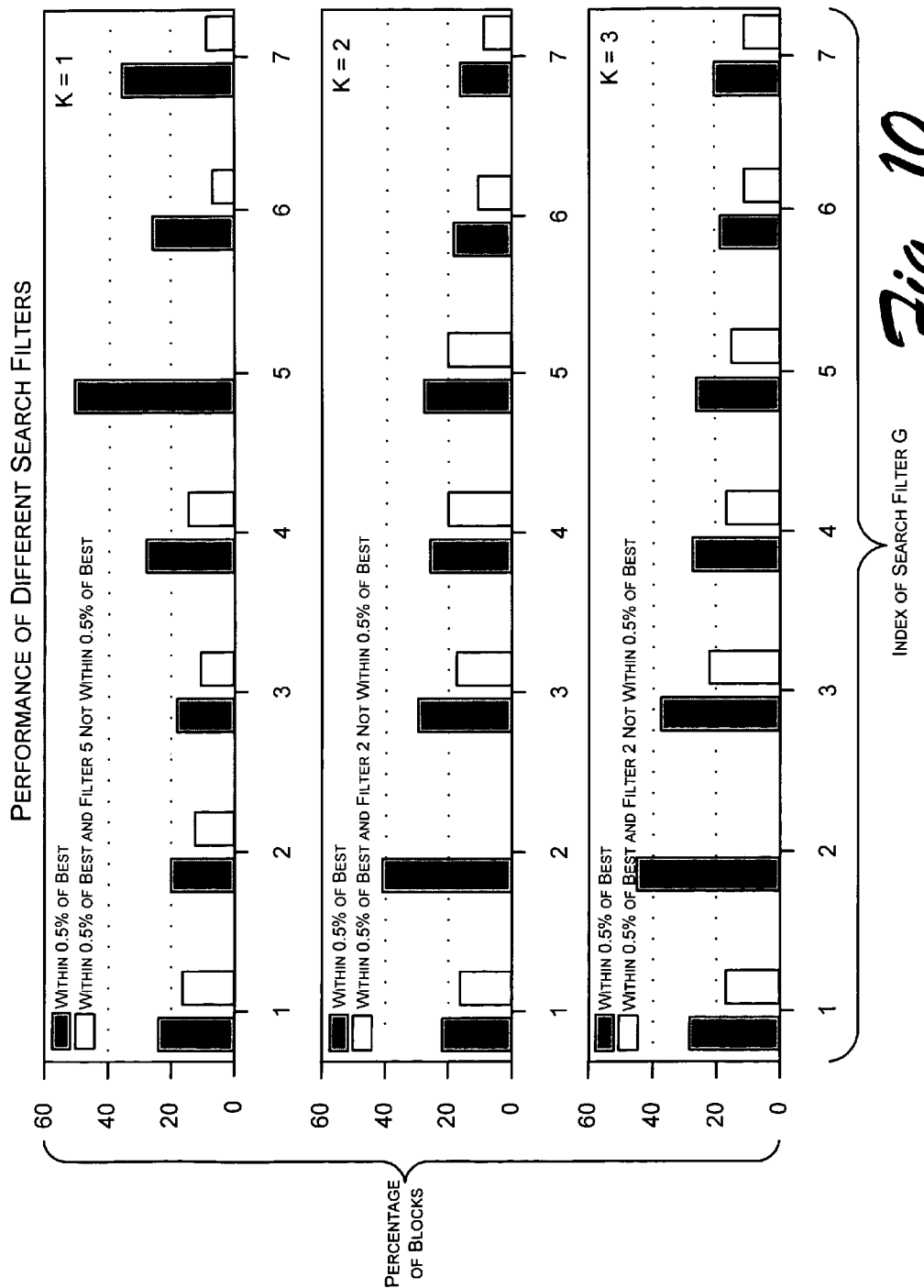
FIG. 10 is a diagrammatic representation of performance of different search filters across first, second, and third iterations of an exemplary method.

FIG. 10 shows performance of search filters g∈G for each iteration. The left member of each pair of bars indexed by i gives the percentage of time that a similar block generated from $g_i$ had an entropy compression within 0.5% of the best compression that was obtained. In one implementation, filter $g_5$, a filter 410 that has each MLT coefficient weighted by the ratio of the entropy of that coefficient for the clip 402 to the average absolute value of that coefficient, outperforms the other filters, i.e., it finds a candidate within 0.5% of the best candidate about half the time. For the second two iterations, the mid-pass filter $g_2$ outperforms the other filters, finding the best candidate 40% and 43% percent of the time respectively. The right member of each pair of bars considers the effect of the remaining filters on those blocks where the top performing filter ($g_5$ for K=1, $g_2$ for K=2, 3) did not produce a candidate block yielding a compression rate within 0.5% of the best compression rate obtained.

In one implementation, to improve the choice of set G, for example in the case of K=1, the left hand bars indicate that $g_6$ and $g_7$ might be discardable since they do not perform well as often as $g_5$ and tend to perform well mostly on blocks that $g_5$ also performs well on.

Recall that $g_6$ and $g_7$ search for L2 similarity in the time domain. An exemplary result that there may be better filters than $g_6$ and $g_7$ on all iterations indicates that there is a significant difference between small entropy and small Euclidean distance. Thus, in one implementation, an exemplary method 400 undergoes some optimization by making the set G iteration dependent, and by using select elements for the set. Selection of $g_5$ is the only choice that aims to take into account the difference between similarity in the L2 sense and the entropy sense.

Implementation Using Beat Information

One of the most robust events in music is its beat. An overwhelming amount of music content is defined using well-known time-signature notations that rigorously dictate the playing tempo. Rarely, music possesses intentional and significant variance in rhythm and even then it does not last more than several seconds, or may have an additional rhythm of its own. So, although music is authored in diverse ways, one predominant characteristic is a rigorous enforcement of an accurately repeating beat.

In one implementation, an exemplary similarity search 408 uses beat detection to speed up the search for similar blocks. Audio clips 402 can be sequenced into beats using a fast, off-the-shelf beat detection system based on the EM algorithm as described in D. Kirovski and H. Attias, "Audio Watermark Robustness to Desynchronization via Beat Detection," *Info Hiding Workshop*, 2002. The beat information can be denoted as a pseudoperiodic sequence $T=\{t_0=1 \cup t_j, j=1 \ldots |T|-1\}$. Any two consecutive pointers in T are such that $|t_j - t_{j-1} - \tau| \leq \epsilon$, j>1, where $\tau$ is the beat period and $\epsilon$ is its maximum deviation. One way to model the music beat is via the repetitiveness of the signal energy (Ibid).

Let $u_j$ denote the signal energy at beat j. To compute $u_j$, the signal waveform in the time domain $x_j = \{x_{t(j-1)}, \ldots, x_{tj-1}\}$. $u_j$ is the mean squared value of $x_j$. The beat is modeled by assuming that $u_j$ is approximately periodic across j, with a beat period equal to $\tau$.

In one implementation, after computing T for each audio clip 402, the similarities were computed for one-hundred 1024-long MLT blocks randomly sampled from the first 45 seconds of each clip 402. For each sampled block $x_i$ and each considered filter $f_j(\cdot) \in F$, a candidate block pool 312 was established: e.g., ten blocks that correlated the best with $x_i$ in the $f_i(\cdot)$ domain. The relative position offset $\rho(x_i, x_m)$ for a block $x_m$ in the candidate pool 312 was computed with respect to $x_i$ and within respective containing beats. For each block $x_i$ and its candidate block $x_m$ starting at the i-th and m-th sample of x respectively, the borders of their containing beats are denoted as $t_i$, $t_i+1$ and $t_m$, $t_{m+1}$ respectively. Parameters can be set as follows: $a=(i-t_i)-(m-t_m)$, $b=(i-t_{i+1})-(m-t_m)$, and $c=(i-t_i)-(m-t_{m+1})$. The relative position offset $\rho$ (i.e., offset from a beat) can be defined:

$$\rho(x_i, x_m) \equiv \begin{cases} a, & |a| = \min(|a|, |b|, |c|) \\ b, & |b| = \min(|a|, |b|, |c|) \\ c, & |c| = \min(|a|, |b|, |c|) \end{cases} \quad (3)$$

Figure 11:
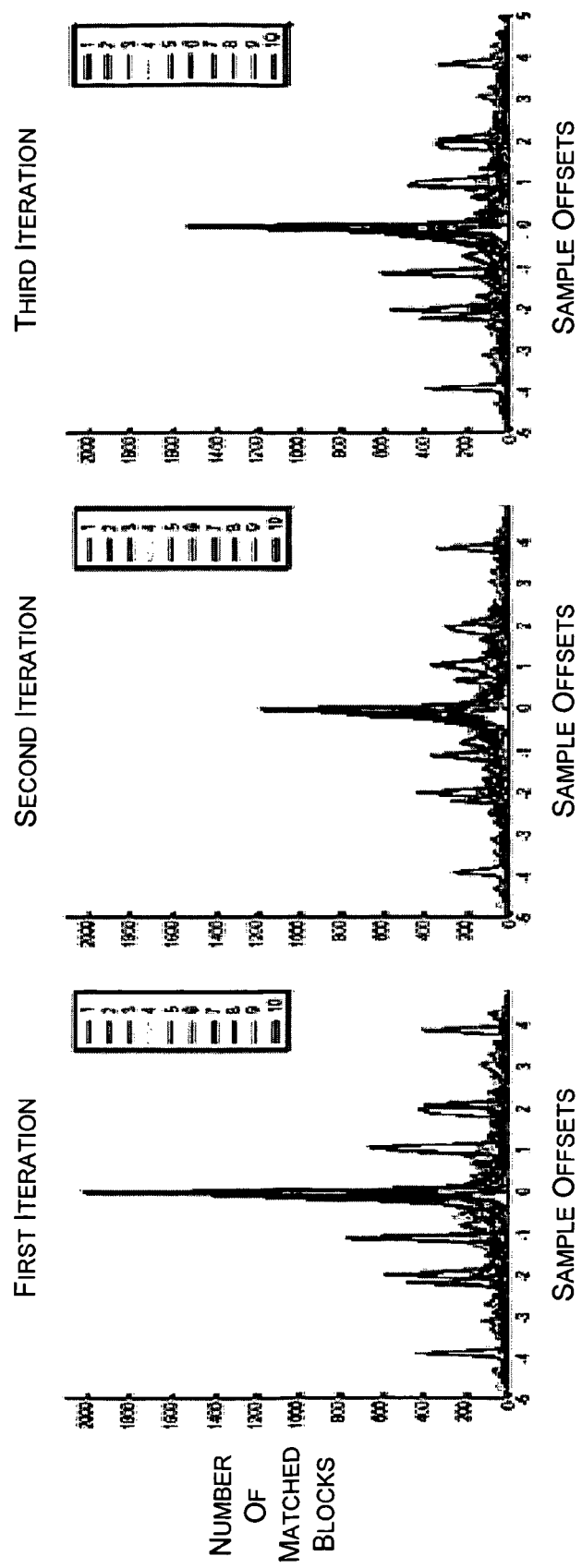
FIG. 11 is a diagrammatic representation of audio blocks selected in first, second, and third iterations of a similarity search in relation to an offset distance from a beat of an audio signal.
Figure 12:
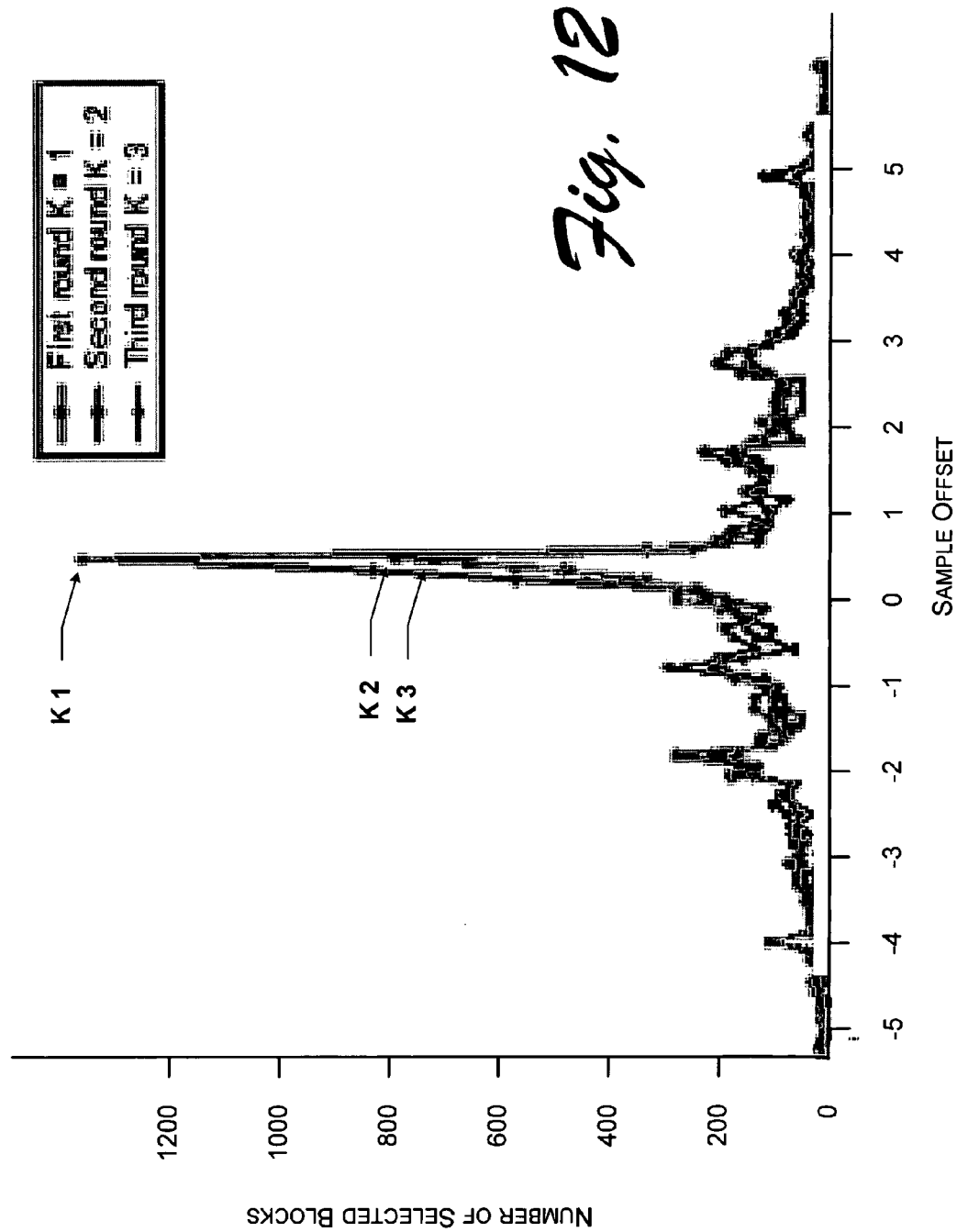
FIG. 12 is a diagrammatic representation of exemplary blocks selected as best entropy-matches during iterations of an exemplary method in relation to an offset distance from a beat in an audio signal.

FIG. 11 shows a histogram of the relative position offset parameter $\rho(\ )$ (see Equation (3)) for each audio clip 402 individually and for each of the three rounds K=1, 2, 3 (left to right) performed during a "greedy" implementation of a similarity search 408. It can be observed that for all iterations, the majority of correlated blocks are co-located with the target block within respective beats. This property slowly fades as the iteration count K increases. Similarly, FIG. 12 shows a histogram of the $\rho(\ )$ parameter for the set of best entropy-matched blocks for each iteration individually. A large number of selected blocks are found in a relatively narrow co-located region within respective beats. Within a region of size equal to ⅛th of the beat length, typically more than half the selected blocks are found.

An exemplary compression engine 102 can encode the set of block pointers W using a coder that takes into account the probability distribution functions of FIG. 12. Typically, pointer entropy computed based on FIG. 12 is about 1.0-1.5 bits lower than equiprobable pointer encoding. Second, a similarity search 408 can be significantly improved (sped up by a factor of 2-5 times) by restricting the search window 406 to the narrow regions co-located with the target block. Such a restriction of the search window 406 may reduce the pointer entropy even further, about 2.5-3 bits lower than equiprobable pointer encoding.

Exemplary Decompression

While compressing an audio clip 402 using an exemplary method 400 may be a computationally challenging task with some implementations of the similarity search 408, decompression processes may only be marginally slower than the speed of an off-the-shelf codec such as MP3 or AAC. Since the basis points must be available during decompression, decompressed audio is not discarded as long as its blocks can be used as basis vectors. Thus, the current search window 406 can be stored in operating memory during decompression.

Table (4) provides a pseudo-code overview of two steps during exemplary decompression:

TABLE 4

Pseudo-code of an exemplary method for
generalized lossy Lempel-Ziv decompression.

For each block $x_i$
1 Decode W, A, F, and the error $\epsilon_i + m(x_i, r_i, b_i)$.

2 Compute $x_i = \sum_{j=1}^{K} a_j f_j(w_j) + \varepsilon_i$.

For each reconstructed block $x_i$, the information from the compressed stream is decoded; then the other entities can be extracted: the set of pointers to prior blocks W; the scalar amplifiers A; the filters F applied onto each block pointed to by W to compute the basis vectors; and the error vector $\epsilon_i = m(x_i, r_i, b_i)$. In the last step, the reconstruction is computed as $$x_i = \sum_{j=1}^{K} a_j f_j(w_j) + \varepsilon_i.$$

Since the basis can be constructed from the source in the time or frequency domain, during decompression the reconstruction window that equals the search window 406 is maintained in the appropriate domain.

CONCLUSION

The foregoing discussion describes generalized Lempel-Ziv compression for multimedia signals. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A computing device implemented method, comprising selecting prior segments of an audio signal, wherein the selecting includes:
   selecting a first prior segment as a first basis vector for the combination;
   selecting a transform and a scalar associated with the first prior segment, wherein:
      the first prior segment, the transform, and the scalar result in a minimum entropy of the error,
      the minimum entropy of the error is determined by $$\arg\min_{W,A,F} H\left\{m\left[x_i, \sum_{j=1}^{K} a_j f_j(w_j), b_i\right]\right\}$$

each block (w) of the search segment has an associated transform (f), an associated scalar (a), and an associated psychoacoustic mask (b)
   $x_i$ represents a current block, W represents a set of pointers, F represents a set of filters, and A represents a set of amplifiers,
   H represents an entropy function, and m represents a masking function;
   describing a current segment of the audio signal as a combination of the selected prior segments to compress the audio signal; the computing device outputting the audio signal having undergone compression.

2. The method as recited in claim 1, wherein the selecting comprises choosing at least one of the prior segments based on a greater similarity to the current segment than other prior segments.

3. The method as recited in claim 2, wherein the selecting uses a L2 Euclidean norm to determine the greater similarity.

4. The method as recited in claim 1, wherein the describing uses a generalized Lempel-Ziv linear combination of filtered transforms of the selected prior segments.

5. The method as recited in claim 1, wherein the selecting prior segments includes selecting segments, which when combined, produce the least error in representing the current segment.

6. The method as recited in claim 1, further comprising applying a psychoacoustic mask to the first prior segment.

7. The method as recited in claim 1, further comprising:
subtracting a representation of the first prior segment from a representation of the current segment to obtain a remainder of the audio signal of the current segment; and
selecting a subsequent prior segment, an associated subsequent transform, and an associated subsequent scalar to describe the remainder of the signal.

8. The method as recited in claim 7, wherein the selecting of the subsequent prior segment, the subsequent transform, and the subsequent scalar is based on minimizing the entropy of the error as determined by $$\arg\min_{W,A,F} H\left\{m\left[x_i \sum_{j=1}^{K} a_j f_j(w_j), b_i\right]\right\}.$$

9. The method as recited in claim 7, further comprising performing multiple iterations of:
subtracting a representation of a prior segment from the remainder of the audio signal of the current segment; and
selecting a subsequent prior segment, an associated subsequent transform, and an associated subsequent scalar to describe the remainder of the signal based on minimizing the entropy of the error.

10. The method as recited in claim 1, further comprising:
selecting a subsequent current segment of the audio signal; and
describing the subsequent current segment as a combination of selected prior segments to compress the audio signal.

11. A storage medium comprising a plurality of executable instructions which, when executed, implement a method according to claim 1.

12. A system comprising a compression engine embodied in a memory of a computing device, comprising:
an audio signal buffer;
a current block selector to designate a current block of an audio signal in the audio signal buffer;
a search window selector to designate a search segment of the audio signal, wherein the search segment precedes the current block;
a similarity search iterator to select a prior block of the search segment, wherein:
the prior block is similar to the current block; and
the similarity search iterator minimizes an entropy of error by evaluating each of multiple blocks of the search segment in $$\left(\arg\min_{W,A,F} H\left\{m\left[x_i \sum_{j=1}^{K} a_j f_j(w_j), b_i\right]\right\}\right)$$

to find the prior block that results in the least entropy of error, wherein:
each block (w) of the search segment has an associated transform (f), an associated scalar (a), and an associated psychoacoustic mask (b)
$x_i$ represents a current block, W represents a set of pointers, F represents a set of filters, and A represents a set of amplifiers, and
H represents an entropy function, and m represents a masking function.

13. The system as recited in claim 12, wherein the similarity search iterator selects the prior block based on minimizing an entropy of error associated with using the prior block, using an associated transform, and using an associated scalar to predict the current block.

14. The system as recited in claim 12, further comprising a psychoacoustic mask engine to distinguish audible from inaudible frequency coefficients in one or more blocks of the audio signal.

15. A system, comprising:
means for selecting a first prior segment of an audio signal based on similarity to a current segment of an audio signal;
means for selecting additional prior segments of the audio signal to describe the current segment by linear combination of the additional prior segments with the first prior segment,
wherein the means for selecting additional prior segments includes a means for evaluating an entropy of error associated with using each candidate prior segment by evaluating each candidate prior segment via $$\arg\min_{W,A,F} H\left\{m\left[x_i, \sum_{j=1}^{K} a_j f_j(w_j), b_i\right]\right\}$$

to find the prior segment that results in the least entropy of error, wherein:
each segment (w) of the audio signal has an associated transform (f), an associated scalar (a), and an associated mask (b),
$x_i$ represents a current segment, W represents a set of pointers, F represents a set of filters, and A represents a set of amplifiers,
H represents an entropy function, and m represents a masking function.

16. The system as recited in claim 15, further comprising means for selecting prior segments of variable segment length.

17. The system as recited in claim 15, further comprising means for beat detection.

* * * * *

UNITED STATES PATENT AND TRADEMARK OFFICE
CERTIFICATE OF CORRECTION

PATENT NO. : 7,505,897 B2
APPLICATION NO. : 11/045843
DATED : March 17, 2009
INVENTOR(S) : Darko Kirovski et al.

It is certified that error appears in the above-identified patent and that said Letters Patent is hereby corrected as shown below:

In column 11, line 65, delete "complements" and insert -- complement $f_5$ --, therefor.

In column 14, line 43, in Claim 1, delete "$X_i$" and insert -- $X_i$, --, therefor.

In column 15, line 23, in Claim 8, delete "$X_i$" and insert -- $X_i$, --, therefor.

In column 16, line 4, in Claim 12, delete "$X_i$" and insert -- $X_i$, --, therefor.

Signed and Sealed this
Nineteenth Day of July, 2011

David J. Kappos
*Director of the United States Patent and Trademark Office*